United States Patent
Pavlacky

(10) Patent No.: US 9,523,915 B2
(45) Date of Patent: Dec. 20, 2016

(54) IMAGE FORMING MATERIALS, PREPARATIONS, AND COMPOSITIONS

(71) Applicant: Carestream Health, Inc., Rochester, NY (US)

(72) Inventor: Erin C. Pavlacky, Lakeland Shores, MN (US)

(73) Assignee: Carestream Health, Inc., Rochester, NY (US)

(*) Notice: Subject to any disclaimer, the term of this patent is extended or adjusted under 35 U.S.C. 154(b) by 0 days.

(21) Appl. No.: 14/868,503

(22) Filed: Sep. 29, 2015

(65) Prior Publication Data

US 2016/0124306 A1    May 5, 2016

Related U.S. Application Data

(60) Provisional application No. 62/074,681, filed on Nov. 4, 2014.

(51) Int. Cl.
| | | |
|---|---|---|
| *G03F 7/06* | (2006.01) | |
| *G03F 7/36* | (2006.01) | |
| *G03C 1/498* | (2006.01) | |

(52) U.S. Cl.
CPC ............ *G03F 7/06* (2013.01); *G03C 1/49863* (2013.01); *G03F 7/36* (2013.01)

(58) Field of Classification Search
CPC .......... G03F 7/06; G03F 7/36; G03C 1/49863
USPC ................................. 430/616, 617
See application file for complete search history.

(56) References Cited

U.S. PATENT DOCUMENTS

| | | |
|---|---|---|
| 2,444,605 A | 7/1948 | Heimbach et al. |
| 2,489,341 A | 11/1949 | Waller et al. |
| 2,565,418 A | 8/1951 | Yackel et al. |
| 2,566,263 A | 8/1951 | Trivelli et al. |
| 2,597,915 A | 5/1952 | Yutzy et al. |
| 2,614,928 A | 10/1952 | Yutzy et al. |
| 2,618,556 A | 11/1952 | Hewitson et al. |
| 2,694,716 A | 11/1954 | Allen et al. |
| 2,839,405 A | 6/1958 | Jones et al. |
| 2,886,437 A | 5/1959 | Piper |
| 3,074,809 A | 1/1963 | Owen |
| 3,080,254 A | 3/1963 | Grant, Jr. |
| 3,220,839 A | 11/1965 | Herz et al. |
| 3,241,969 A | 3/1966 | Hart et al. |
| 3,287,135 A | 11/1966 | Anderson et al. |
| 3,326,652 A | 6/1967 | Plumat |
| 3,330,663 A | 7/1967 | Weyde et al. |
| 3,375,112 A | 3/1968 | Theodorou |
| 3,438,776 A | 4/1969 | Yudelson |
| 3,440,049 A | 4/1969 | Moede |
| 3,446,648 A | 5/1969 | Workman |
| 3,457,075 A | 7/1969 | Morgan |
| 3,700,458 A | 10/1972 | Lindholm |
| 3,785,830 A | 1/1974 | Sullivan et al. |
| 3,832,186 A | 8/1974 | Masuda et al. |
| 3,839,049 A | 10/1974 | Simons |
| 3,844,797 A | 10/1974 | Willems et al. |
| 3,847,612 A | 11/1974 | Winslow |
| 3,951,660 A | 4/1976 | Hagemann et al. |
| 3,985,565 A | 10/1976 | Gabrielsen et al. |
| 4,076,539 A | 2/1978 | Ikenoue et al. |
| 4,082,901 A | 4/1978 | Laridon et al. |
| 4,123,274 A | 10/1978 | Knight et al. |
| 4,123,282 A | 10/1978 | Winslow |
| 4,220,709 A | 9/1980 | deMauriac |
| 4,260,677 A | 4/1981 | Winslow et al. |
| 4,504,575 A | 3/1985 | Lee |
| 4,761,361 A | 8/1988 | Ozaki et al. |
| 4,775,613 A | 10/1988 | Hirai et al. |
| 5,149,620 A | 9/1992 | Simpson et al. |
| 5,158,866 A | 10/1992 | Simpson et al. |
| 5,175,081 A | 12/1992 | Krepski et al. |
| 5,250,386 A | 10/1993 | Aono et al. |
| 5,298,390 A | 3/1994 | Sakizadeh et al. |
| 5,300,420 A | 4/1994 | Kenney et al. |
| 5,368,979 A | 11/1994 | Freedman et al. |
| 5,369,000 A | 11/1994 | Sakizadeh et al. |
| 5,374,514 A | 12/1994 | Kirk et al. |
| 5,382,504 A | 1/1995 | Shor et al. |
| 5,434,043 A | 7/1995 | Zou et al. |
| 5,460,938 A | 10/1995 | Kirk et al. |

(Continued)

FOREIGN PATENT DOCUMENTS

| | | |
|---|---|---|
| EP | 0 227 141 | 11/1986 |
| EP | 0 600 586 | 11/1993 |

(Continued)

OTHER PUBLICATIONS

*Research Disclosure*, Jun. 1978, item 17029, 7 pages.
*Research Disclosure*, Apr. 1983, item 22812, 4 pages.
*Research Disclosure*, Oct. 1983, item 23419, 4 pages.
*Unconventional Imaging Processes*, E. Brinckman et al. (Eds.), The Focal Press, London and New York, 1978, pp. 74-75.
D. H. Klosterboer, *Imaging Processes and Materials*, (*Neblette's Eighth Edition*), J. Sturge, V. Walworth, and A. Shepp, Eds., Van Nostrand-Reinhold, New York, 1989, Chapter 9, pp. 279-291.

(Continued)

*Primary Examiner* — Geraldina Visconti

(74) *Attorney, Agent, or Firm* — Reed L. Christiansen; Elizabeth Q. Shipsides

(57) ABSTRACT

Coating compositions and image forming materials made therefrom, the coating compositions comprising at least one non-photosensitive source of reducible silver ions, at least one reducing agent capable of reducing the reducible silver ions, a first binder comprising vinyl butyral repeat units and vinyl alcohol repeat units, a second binder comprising vinyl butyral repeat units and vinyl alcohol repeat units, the second binder having a composition differing from that of the first binder, and a third binder comprising vinyl pyrrolidone repeat units and vinyl acetate repeat units.

5 Claims, No Drawings

(56) References Cited

U.S. PATENT DOCUMENTS

| | | | |
|---|---|---|---|
| 5,462,910 A | 10/1995 | Ito et al. |
| 5,464,737 A | 11/1995 | Sakizadeh et al. |
| 5,491,059 A | 2/1996 | Whitcomb |
| 5,543,453 A | 8/1996 | Ito et al. |
| 5,582,953 A | 12/1996 | Uyttendaele et al. |
| 5,594,143 A | 1/1997 | Kirk et al. |
| 5,599,647 A | 2/1997 | Defieuw et al. |
| 5,716,772 A | 2/1998 | Taguchi |
| 5,817,598 A | 10/1998 | Defieuw et al. |
| 5,928,857 A | 7/1999 | Geisler et al. |
| 5,939,249 A | 8/1999 | Zou |
| 6,013,420 A | 1/2000 | Wingender et al. |
| 6,096,486 A | 8/2000 | Emmers et al. |
| 6,143,487 A | 11/2000 | Philip et al. |
| 6,146,822 A | 11/2000 | Asanuma et al. |
| 6,159,667 A | 12/2000 | Emmers et al. |
| 6,165,704 A | 12/2000 | Miyake et al. |
| 6,171,767 B1 | 1/2001 | Kong et al. |
| 6,190,822 B1 | 2/2001 | Dickerson et al. |
| 6,313,065 B1 | 11/2001 | Horsten et al. |
| 6,355,408 B1 | 3/2002 | Whitcomb et al. |
| 6,413,710 B1 | 7/2002 | Shor et al. |
| 6,465,162 B1 | 10/2002 | Kong et al. |
| 6,472,131 B1 | 10/2002 | Whitcomb |
| 6,599,685 B1 | 7/2003 | Kong |
| 6,713,240 B2 | 3/2004 | Lynch et al. |
| 6,803,177 B2 | 10/2004 | Bokhonov et al. |
| 6,841,343 B2 | 1/2005 | Lynch et al. |
| 6,942,960 B2 | 9/2005 | Maskasky et al. |
| 6,962,893 B2 | 11/2005 | Wachi et al. |
| 7,022,467 B1 | 4/2006 | Ludemann et al. |
| 7,135,432 B2 | 11/2006 | Whitcomb et al. |
| 2003/0143379 A1 | 7/2003 | Wachi et al. |
| 2005/0158675 A9 | 7/2005 | Ohzeki et al. |
| 2008/0057450 A1 | 3/2008 | Ulrich et al. |
| 2009/0081578 A1 | 3/2009 | Burleva et al. |
| 2016/0124306 A1* | 5/2016 | Pavlacky ........... G03C 1/49863 430/616 |

FOREIGN PATENT DOCUMENTS

| | | |
|---|---|---|
| EP | 0 640 589 | 8/1994 |
| GB | 623448 | 7/1945 |
| GB | 1 439 478 | 12/1973 |
| GB | 1 565 043 | 3/1978 |
| JP | 49-13224 A | 2/1974 |
| JP | 50-17216 | 2/1975 |
| JP | 51-42529 | 4/1976 |
| WO | WO 96/15478 | 5/1996 |

OTHER PUBLICATIONS

C. Zou et al., *J. Imaging Sci. Technol.* 1996, 40, pp. 94-103.

M. R. V. Sahyun, *J. Imaging Sci. Technol.* 1998, pp. 42, 23.

Particle Size Analysis, ASTM Symposium on Light Microscopy, R. P. Loveland, 1955, pp. 94-122.

C. E. K. Mees and T. H. James, *The Theory of the Photographic Process*, Third Edition, Macmillan, New York, 1966, Chapter 2.

Z.M. Zhou et al., Synthesis Characterization and Miscibility of Polyvinyl Butyrals of Varying Vinyl Alcohol Contents, Turkish Journal of Chemistry, vol. 21, No. 4, pp. 229-238, Oct. 1997, ISSN: 1300-0527.

International Search Report, International Application No. PCT/US2015/053086, mail date Jan. 13, 2016, 2 Pages.

* cited by examiner

IMAGE FORMING MATERIALS, PREPARATIONS, AND COMPOSITIONS

CROSS REFERENCE TO RELATED APPLICATIONS

This application claims the benefit of U.S. Provisional Application No. 62/074,681, filed Nov. 4, 2014, entitled "IMAGE FORMING MATERIALS, PREPARATIONS, AND COMPOSITIONS," which is hereby incorporated by reference in its entirety.

BACKGROUND

Silver-containing direct thermographic and photothermographic imaging materials (that is, thermally developable imaging materials) that are imaged and/or developed using heat and without liquid processing have been known in the art for many years.

Silver-containing direct thermographic imaging materials are non-photosensitive materials that are used in a recording process wherein images are generated by the direct application of thermal energy and in the absence of a processing solvent. These materials generally comprise a support having disposed thereon (a) a relatively or completely non-photosensitive source of reducible silver ions, (b) a reducing composition (acting as a black-and-white silver developer) for the reducible silver ions, and (c) a suitable binder. Thermographic materials are sometimes called "direct thermal" materials in the art because they are directly imaged by a source of thermal energy without any transfer of the image or image-forming materials to another element (such as in thermal dye transfer).

In a typical thermographic construction, the image-forming thermographic layers comprise non-photosensitive reducible silver salts of long chain fatty acids. A preferred non-photosensitive reducible silver source is a silver salt of a long chain aliphatic carboxylic acid having from 10 to 30 carbon atoms, such as behenic acid or mixtures of acids of similar molecular weight. At elevated temperatures, the silver of the silver carboxylate is reduced by a reducing agent for silver ion (also known as a developer), whereby elemental silver is formed. Preferred reducing agents include methyl gallate, hydroquinone, substituted-hydroquinones, hindered phenols, catechols, pyrogallol, ascorbic acid, and ascorbic acid derivatives.

Some thermographic constructions are imaged by contacting them with the thermal head of a thermographic recording apparatus such as a thermal print-head of a thermal printer or thermal facsimile. In such constructions, an anti-stick layer is coated on top of the imaging layer to prevent sticking of the thermographic construction to the thermal head of the apparatus utilized. The resulting thermographic construction is then heated imagewise to an elevated temperature, typically in the range of from about 60 to about 225° C., resulting in the formation of a black-and-white image of silver.

Silver-containing photothermographic imaging materials (that is, photosensitive thermally developable imaging materials) that are imaged with actinic radiation and then developed using heat and without liquid processing, have also been known in the art for many years. Such materials are used in a recording process wherein an image is formed by imagewise exposure of the photothermographic material to specific electromagnetic radiation (for example, X-radiation, or ultraviolet, visible, or infrared radiation) and developed by the use of thermal energy. These materials, also known as "dry silver" materials, generally comprise a support having coated thereon: (a) a photocatalyst (that is, a photosensitive compound such as silver halide) that upon such exposure provides a latent image in exposed grains that are capable of acting as a catalyst for the subsequent formation of a silver image in a development step, (b) a relatively or completely non-photosensitive source of reducible silver ions, (c) a reducing composition (acting as a developer) for the reducible silver ions, and (d) a binder. The latent image is then developed by application of thermal energy.

In photothermographic materials, exposure of the photosensitive silver halide to light produces small clusters containing silver atoms $(Ag^0)_n$. The imagewise distribution of these clusters, known in the art as a latent image, is generally not visible by ordinary means. Thus, the photosensitive material must be further developed to produce a visible image. This is accomplished by the reduction of silver ions that are in catalytic proximity to silver halide grains bearing the silver-containing clusters of the latent image. This produces a black-and-white image. The non-photosensitive silver source is catalytically reduced to form the visible black-and-white negative image of silver while much of the silver halide, generally, remains as silver halide and is not reduced.

In photothermographic materials, the reducing agent for the reducible silver ions, often referred to as a "developer," may be any compound that, in the presence of the latent image, can reduce silver ion to metallic silver and is preferably of relatively low activity until it is heated to a temperature sufficient to cause the reaction. Many compounds have been disclosed in the literature that function as reducing agents for photothermographic materials. Upon heating, and at elevated temperatures, the reducible silver ions are reduced by the reducing agent. This reaction occurs preferentially in the regions surrounding the latent image and produces a negative image of metallic silver having a color that ranges from yellow to deep black depending upon the presence of toning agents and other components in the photothermographic imaging layer(s).

Differences Between Photothermography and Photography

The imaging arts have long recognized that the field of photothermography is clearly distinct from that of photography. Photothermographic materials differ significantly from conventional silver halide photographic materials that require processing with aqueous processing solutions.

In photothermographic imaging materials, a visible image is created in the absence of a processing solvent by heat as a result of the reaction of a reducing agent incorporated within the material. Heating at 50° C. or more is essential for this dry development. In contrast, conventional photographic imaging materials require processing in aqueous processing baths at more moderate temperatures (from 30° C. to 50° C.) to provide a visible image.

In photothermographic materials, only a small amount of silver halide is used to capture light and a non-photosensitive source of reducible silver ions (for example, a silver carboxylate or a silver benzotriazole) is used to generate the visible image using thermal development. Thus, the imaged photosensitive silver halide serves as a catalyst for the physical development process involving the non-photosensitive source of reducible silver ions and the incorporated reducing agent. In contrast, conventional wet-processed, black-and-white photographic materials use only one form of silver (that is, silver halide) that, upon chemical development, is itself at least partially converted into the silver image, or that upon physical development requires addition of an external silver source (or other reducible metal ions that form black images upon reduction to the corresponding metal). Thus, photothermographic materials require an amount of silver halide per unit area that is only a fraction of that used in conventional wet-processed photographic materials.

In photothermographic materials, all of the "chemistry" for imaging is incorporated within the material itself. For example, such materials include a reducing agent (that is, a developer for the reducible silver ions) while conventional photographic materials usually do not. The incorporation of the reducing agent into photothermographic materials can lead to increased formation of various types of "fog" or other undesirable sensitometric side effects.

Therefore, much effort has gone into the preparation and manufacture of photo-thermographic materials to minimize these problems.

Moreover, in photothermographic materials, the unexposed silver halide generally remains intact after development and the material must be stabilized against further imaging and development. In contrast, silver halide is removed from conventional photographic materials after solution development to prevent further imaging (that is, in the aqueous fixing step).

Because photothermographic materials require dry thermal processing, they present distinctly different problems and require different materials in manufacture and use, compared to conventional, wet-processed silver halide photographic materials. Additives that have one effect in conventional silver halide photographic materials may behave quite differently when incorporated in photothermographic materials where the underlying chemistry is significantly more complex. The incorporation of such additives as, for example, stabilizers, antifoggants, speed enhancers, supersensitizers, and spectral and chemical sensitizers in conventional photographic materials is not predictive of whether such additives will prove beneficial or detrimental in photothermographic materials. For example, it is not uncommon for a photographic antifoggant useful in conventional photographic materials to cause various types of fog when incorporated into photothermographic materials, or for supersensitizers that are effective in photographic materials to be inactive in photothermographic materials.

These and other distinctions between photothermographic and photographic materials are described in *Unconventional Imaging Processes*, E. Brinckman et al. (Eds.), The Focal Press, London and New York, 1978, pp. 74-75, in D. H. Klosterboer, *Imaging Processes and Materials*, (*Neblette's Eighth Edition*), J. Sturge, V. Walworth, and A. Shepp, Eds., Van Nostrand-Reinhold, New York, 1989, Chapter 9, pp. 279-291, in C. Zou et al., *J. Imaging Sci. Technol.* 1996, 40, pp. 94-103, and in M. R. V. Sahyun, *J. Imaging Sci. Technol.* 1998, 42, 23.

Different image forming materials, such as, for example, photothermographic, photographic, and thermographic materials have been discussed in various literature. See, e.g., U.S. Pat. No. 5,928,857 to Geisler et al., PCT International Publication No. WO 96/15478 to 3M, U.S. Pat. No. 6,962,893 to Wachi et al., U.S. Patent Application Publication No. 2003/0143379 to Wachi et al., U.S. Pat. No. 5,543,453 to Ito et al., U.S. Pat. No. 5,462,910 to Ito et al., and U.S. Pat. No. 3,375,112 to Theodorou.

DESCRIPTION

All publications, patents, and patent documents referred to in this document are incorporated by reference in their entirety, as though individually incorporated by reference.

U.S. Provisional Application No. 62/074,681, filed Nov. 4, 2014, entitled "IMAGE FORMING MATERIALS, PREPARATIONS, AND COMPOSITIONS," is hereby incorporated by reference in its entirety.

DEFINITIONS

As used herein:

In the descriptions of the materials, "a" or "an" component refers to "at least one" or "one or more" of that component.

"Thermally developable materials" refers to either "photothermographic materials" or "thermographic materials."

"Photothermographic material(s)" means a dry processable integral element comprising a support and at least one photothermographic emulsion layer or a set of photothermographic emulsion layers. The photosensitive silver halide and the source of reducible silver ions may be in one layer and the other necessary components or additives may be distributed, as desired, in the same layer or in one or more adjacent coated layers. These materials may include multilayer constructions in which one or more imaging components are in different layers, but are in "reactive association." For example, one layer can include the non-photosensitive source of reducible silver ions and another layer can include the reducing composition, but the two reactive components are in reactive association with each other.

"Thermographic materials" are similarly defined except that no photosensitive silver halide catalyst is purposely added or created.

When used in photothermography, the term, "imagewise exposing" or "imagewise exposure" means that the material is imaged as a dry processable material using any exposure means that provides a latent image using electromagnetic radiation. This includes, for example, by analog exposure where an image is formed by projection onto the photosensitive material as well as by digital exposure where the image is formed one pixel at a time such as by modulation of scanning laser radiation.

When used in thermography, the term, "imagewise exposing" or "imagewise exposure" means that the material is imaged as a dry processable material using any means that provides an image using heat. This includes, for example, by analog exposure where an image is formed by differential contact heating through a mask using a thermal blanket or infrared heat source, as well as by digital exposure where the image is formed one pixel at a time such as by modulation of thermal print-heads or by thermal heating using scanning laser radiation.

The term "emulsion layer," "imaging layer," "thermographic emulsion layer," or "photothermographic emulsion layer" means a layer of a thermographic or photothermographic material that contains the photosensitive silver halide (when used) and/or non-photosensitive source of reducible silver ions, or a reducing composition. Such layers can also contain additional components or desirable additives. These layers are on what is referred to as the "frontside" of the support.

"Photocatalyst" means a photosensitive compound such as silver halide that, upon exposure to radiation, provides a compound that is capable of acting as a catalyst for the subsequent development of the image-forming material.

"Catalytic proximity" or "reactive association" means that the reactive components are in the same layer or in adjacent layers so that they readily come into contact with each other during imaging and thermal development.

"Simultaneous coating" or "wet-on-wet" coating means that when multiple layers are coated, subsequent layers are coated onto the initially coated layer before the initially coated layer is dry. Simultaneous coating can be used to apply layers on the frontside, backside, or both sides of the support.

"Transparent" means capable of transmitting visible light or imaging radiation without appreciable scattering or absorption.

The phrases "silver salt" and "organic silver salt" refer to an organic molecule having a bond to a silver atom. Although the compounds so formed are technically silver coordination complexes or silver compounds they are also often referred to as silver salts.

"Silver Efficiency" is defined as Dmax divided by the total silver coating weight in units of $g/m^2$.

The terms "coating weight," "coat weight," and "coverage" are synonymous, and are usually expressed in weight or moles per unit area such as $g/m^2$ or $mol/m^2$.

"Ultraviolet region of the spectrum" refers to that region of the spectrum less than or equal to 400 nm (preferably from about 100 nm to about 400 nm) although parts of these ranges may be visible to the naked human eye.

"Visible region of the spectrum" refers to that region of the spectrum of from about 400 nm to about 700 nm.

"Short wavelength visible region of the spectrum" refers to that region of the spectrum of from about 400 nm to about 450 nm.

"Red region of the spectrum" refers to that region of the spectrum of from about 600 nm to about 700 nm.

"Infrared region of the spectrum" refers to that region of the spectrum of from about 700 nm to about 1400 nm.

"Non-photosensitive" means not intentionally light sensitive.

The sensitometric terms "photospeed," "speed," or "photographic speed" (also known as sensitivity), "absorbance," and "contrast" have conventional definitions known in the imaging arts. The sensitometric term "absorbance" is a synonym for optical density (OD).

In photothermographic materials, the term Dmin (lower case), which is also referred to as minimum density, is considered herein as image density achieved when the photothermographic material is thermally developed without prior exposure to radiation. The term Dmax (lower case) is the maximum image density achieved in the imaged area of a particular sample after imaging and development.

The term ΔDmin (lower case) is the change in minimum density between the initial Dmin (lower case) and final Dmin (lower case) after being subjected to a print stability test, accelerated aging test, etc. $\Delta Dmin_B$ (lower case) is the change in minimum density between the initial Dmin (lower case) and final Dmin (lower case) using a blue filter after being subjected to a print stability test. ΔD at 1.2 IOD is the change in density between the initial density and final density at 1.2 imaged optical density. $\Delta Dens_B$ (max) is the change in maximum density between the initial Dmax (lower case) and final Dmax (lower case) using a blue filter after being subjected to a print stability test. $\Delta Dmin_v$ (lower case) is the change in minimum density between the initial Dmin (lower case) and final Dmin (lower case) using a visual, standard filter after being subjected to a print stability test.

The term "hot-dark print stability" refers to the susceptibility of imaged and processed (photo)thermographic materials to undergo changes in such properties as Dmin, Dmax, tint, and tone during storage under hot conditions in the absence of light.

The term "light chamber print stability" refers to the susceptibility of imaged and processed (photo)thermographic materials to undergo changes in such properties as Dmin, Dmax, tint, and tone during storage in a light chamber.

Image Tone refers to a measure of the extent of yellowness of the silver image. It is the difference in the optical density measured using a blue filter, from that of the optical density measured using a visible filter, at a visible density of 2.0. Larger image Tone values indicate a bluer image. For use in medical imaging applications, a bluer image is generally preferred.

Speed-2 ("Spd2") is Log (1/E)+4 corresponding to the density value of 1.0 above Dmin where E is the exposure in $ergs/cm^2$.

Speed-3 ("Spd3") is Log (1/E)+4 corresponding to the density value of 2.9 above Dmin where E is the exposure in $ergs/cm^2$.

Average Contrast-1 ("AC-1") is the absolute value of the slope of the line joining the density points at 0.6 and 2.0 above Dmin.

Average Contrast-2 ("AC-2") is the absolute value of the slope of the line joining the density points at 1.0 and 2.4 above Dmin.

Average Contrast-3 ("AC-3") is the absolute value of the slope of the line joining the density points at 2.4 and 2.9 above Dmin.

Average Contrast-4 ("AC-4") is the absolute value of the slope of the line joining the density points at 2.8 and 3.3 above Dmin.

Tg is the glass transition temperature and can be determined by Differential Scanning calorimetry.

Copolymers (including any number of different types of repeat units, such as, for example, terpolymers) are included in the definition of polymers.

As is well understood in this art, for the chemical compounds herein described, substitution is not only tolerated, but is often advisable, and various substituents are anticipated on the compounds used in the present invention unless otherwise stated. Thus, when a compound is referred to as "having the structure" of a given formula or being a "derivative" of a compound, any substitution that does not alter the bond structure of the formula or the shown atoms within that structure is included within the formula, unless such substitution is specifically excluded by language.

Other aspects, advantages, and benefits of the present invention are apparent from the detailed description, examples, and embodiments provided in this application.

The Photocatalyst

As noted above, photothermographic materials include one or more photocatalysts in the photothermographic emulsion layer(s). Useful photocatalysts are typically photosensitive silver halides such as silver bromide, silver iodide, silver chloride, silver bromoiodide, silver chlorobromoiodide, silver chlorobromide, and others readily apparent to one skilled in the art. Mixtures of silver halides can also be used in any suitable proportion. Silver bromide and silver iodide are preferred. More preferred is silver bromoiodide in which any suitable amount of iodide is present up to almost 100% silver iodide and more likely up to about 40 mol % silver iodide. Even more preferably, the silver bromoiodide comprises at least 70 mol % (preferably at least 85 mol % and more preferably at least 90 mol %) bromide (based on total silver halide). The remainder of the halide is iodide, chloride, or chloride and iodide. Preferably the additional halide is iodide. Silver bromide and silver bromoiodide are most preferred, with the latter silver halide generally having up to 10 mol % sifter iodide.

In some embodiments of aqueous-based photothermographic materials, higher amounts of iodide may be present in homogeneous photosensitive silver halide grains, and particularly from about 20 mol % to the saturation limit of iodide as described, for example, U.S. Patent Application Publication 2004/0053173 (Maskasky et al.).

The silver halide grains may have any crystalline habit or morphology including, but not limited to, cubic, octahedral, tetrahedral, orthorhombic, rhombic, dodecahedral, other polyhedral, tabular, laminar, twinned, or platelet morphologies and may have epitaxial growth of crystals thereon. If desired, a mixture of grains with different morphologies can be employed. Silver halide grains having cubic and tabular morphology (or both) are preferred.

The silver halide grains may have a uniform ratio of halide throughout. They may also have a graded halide content, with a continuously varying ratio of, for example, silver bromide and silver iodide or they may be of the core-shell type, having a discrete core of one or more silver halides, and a discrete shell of one or more different silver halides. Core-shell silver halide grains useful in photothermographic materials and methods of preparing these materials are described in U.S. Pat. No. 5,382,504 (Shor et al.). Iridium and/or copper doped core-shell and non-core-shell grains are described in U.S. Pat. No. 5,434,043 (Zou et al.) and U.S. Pat. No. 5,939,249 (Zou). Bismuth(III)-doped high silver iodide emulsions for aqueous-based photothermographic materials are described in U.S. Pat. No. 6,942,960 (Maskasky et al.).

In some instances, it may be helpful to prepare the photosensitive silver halide grains in the presence of a hydroxytetraazaindene (such as 4-hydroxy-6-methyl-1,3,3a, 7-tetraazaindene) or an N-heterocyclic compound comprising at least one mercapto group (such as 1-phenyl-5-mercaptotetrazole) as described in U.S. Pat. No. 6,413,710 (Shor et al.).

The photosensitive silver halide can be added to (or formed within) the emulsion layer(s) in any fashion as long as it is placed in catalytic proximity to the non-photosensitive source of reducible silver ions.

It is preferred that the silver halides be preformed and prepared by an ex-situ process. With this technique, one has the possibility of more precisely controlling the grain size, grain size distribution, dopant levels, and composition of the silver halide, so that one can impart more specific properties to both the silver halide grains and the resulting photothermographic material.

In some constructions, it is preferable to form the non-photosensitive source of reducible silver ions in the presence of ex-situ-prepared silver halide. In this process, the source of reducible silver ions, such as a long chain fatty acid silver carboxylate (commonly referred to as a silver "soap" or homogenate), is formed in the presence of the preformed silver halide grains. Co-precipitation of the source of reducible silver ions in the presence of silver halide provides a more intimate mixture of the two materials to provide a material often referred to as a "preformed soap." (See, e.g., U.S. Pat. No. 3,839,049 (Simons)).

In some constructions, it is preferred that preformed silver halide grains be added to and "physically mixed" with the non-photosensitive source of reducible silver ions.

Preformed silver halide emulsions can be prepared by aqueous or organic processes and can be unwashed or washed to remove soluble salts. Soluble salts can be removed by any desired procedure for example as described in U.S. Pat. No. 2,489,341 (Waller et al.), U.S. Pat. No. 2,565,418 (Yackel), U.S. Pat. No. 2,614,928 (Yutzy et al.), U.S. Pat. No. 2,618,556 (Hewitson et al.), and U.S. Pat. No. 3,241,969 (Hart et al.).

It is also effective to use an in-situ process in which a halide- or halogen-containing compound is added to an organic silver salt to partially convert the silver of the organic silver salt to silver halide. Inorganic halides (such as zinc bromide, zinc iodide, calcium bromide, lithium bromide, lithium iodide, or mixtures thereof) or an organic halogen-containing compound (such as N-bromo-succinimide or pyridinium hydrobromide perbromide) can be used. The details of such in-situ generation of silver halide are well known and described in U.S. Pat. No. 3,457,075 (Morgan et al.).

It is particularly effective to use a mixture of both preformed and in-situ generated silver halide. The preformed silver halide is preferably present in a preformed soap.

Additional methods of preparing silver halides and organic silver salts and blending them are described in *Research Disclosure*, June 1978, item 17029, U.S. Pat. No. 3,700,458 (Lindholm), U.S. Pat. No. 4,076,539 (Ikenoue et al.), Japan Kokai 49-013224 (Fuji), 50-017216 (Fuji), and 51-042529 (Fuji).

The silver halide grains used in the imaging formulations can vary in average diameter of up to several micrometers depending on the desired use. Preferred silver halide grains for use in preformed emulsions containing silver carboxylates are cubic grains having a number average particle size of from about 0.01 to about 1.0 µm, more preferred are those having a number average particle size of from about 0.03 to about 0.1 µm. It is even more preferred that the grains have a number average particle size of 0.06 µm or less, and most preferred that they have a number average particle size of from about 0.03 to about 0.06 µm. Mixtures of grains of various average particle sizes can also be used. Preferred silver halide grains for high-speed photothermographic constructions are tabular grains having an average thickness of at least 0.02 µm and up to and including 0.10 µm, an equivalent circular diameter of at least 0.5 µm and up to and including 8 µm, and an aspect ratio of at least 5:1. More preferred are those having an average thickness of at least 0.03 µm and up to and including 0.08 µm, an equivalent circular diameter of at least 0.75 µm and up to and including 6 µm, and an aspect ratio of at least 10:1.

The average size of the photosensitive silver halide grains is expressed by the average diameter if the grains are spherical, and by the average of the diameters of equivalent circles for the projected images if the grains are cubic or in other non-spherical shapes. Representative grain sizing methods are described in *Particle Size Analysis*, ASTM Symposium on Light Microscopy, R. P. Loveland, 1955, pp. 94-122, and in C. E. K. Mees and T, H. James. *The Theory of the Photographic Process*, Third Edition, Macmillan, New York, 1966, Chapter 2. Particle size measurements may be expressed in terms of the projected areas of grains or approximations of their diameters. These will provide reasonably accurate results if the grains of interest are substantially uniform in shape.

The one or more light-sensitive silver halides are preferably present in an amount of from about 0.005 to about 0.5 mole, more preferably from about 0.01 to about 0.25 mole, and most preferably from about 0.03 to about 0.15 mole, per mole of non-photosensitive source of reducible silver ions.

Non-Photosensitive Source of Reducible Silver Ions

The non-photosensitive source of reducible silver ions may be any silver-organic compound that contains reducible silver(I) ions. Such compounds may be silver salts of silver coordinating ligands. Such a silver salt may be an organic silver salt that is comparatively stable to light and forms a silver image when heated to 50° C. or higher in the presence of a reducing agent. Mixtures of the same or different types of silver salts can be used if desired.

Suitable organic silver salts may include silver salts of organic compounds having a carboxylic acid group. Examples thereof include silver salts of aliphatic and aromatic carboxylic acids. Silver salts of long-chain aliphatic carboxylic acids are preferred. The chains typically contain 10 to 30, and preferably 15 to 28, carbon atoms. Preferred examples of the silver salts of aliphatic carboxylic acids include silver behenate, silver arachidate, silver stearate, silver oleate, silver laurate, silver caprate, silver myristate, silver palmitate, silver maleate, silver fumarate, silver tartarate, silver furoate, silver linoleate, silver butyrate, silver camphorate, and mixtures thereof. Preferably, silver behenate is used alone or in mixtures with other silver salts.

In some embodiments, a highly crystalline silver behenate can be used as part or all of the non-photosensitive sources of reducible silver ions as described in U.S. Pat. No. 6,096,486 (Emmers et al.) and U.S. Pat. No. 6,159,667 (Emmers et al.), both of which are incorporated by reference in their entirety. Moreover, the silver behenate can be used in its one or more crystallographic phases (such as a mixture of phases I, II and/or III) as described in U.S. Pat. No. 6,677,274 (Geuens et al.), which is incorporated by reference in its entirety.

Other examples of silver salts include but are not limited to, silver salts of aromatic carboxylic acids and other carboxylic acid group-containing compounds, silver salts of aliphatic carboxylic acids containing a thioether group as described in U.S. Pat. No. 3,330,663 (Weyde et al.), silver carboxylates comprising hydrocarbon chains incorporating ether or thioether linkages, or sterically hindered substitution in the α- (on a hydrocarbon group) or ortho- (on an aromatic group) position, as described in U.S. Pat. No. 5,491,059 (Whitcomb), silver salts of aliphatic, aromatic, or heterocyclic dicarboxylic acids, silver salts of sulfonates as described in U.S. Pat. No. 4,504,575 (Lee), silver salts of sulfosuccinates as described in EP 0 227 141 A1 (Agfa), silver salts of acetylenes as described in U.S. Pat. No. 4,761,361 (Ozaki et al.) and U.S. Pat. No. 4,775,613 (Hirai et al.), silver salts of compounds containing mercapto or thione groups and derivatives thereof (such as those having a heterocyclic nucleus containing 5 or 6 atoms in the ring, at least one of which is a nitrogen atom), as described in U.S. Pat. No. 4,123,274 (Knight et al.) and U.S. Pat. No. 3,785,830 (Sullivan et al.), silver salts of mercapto or thione substituted compounds that do not contain a heterocyclic nucleus, silver salts of compounds containing an imino group (such as silver salts of benzotriazole and substituted derivatives thereof), silver salts of 1,2,4-triazoles or 1-H-tetrazoles as described in U.S. Pat. No. 4,220,709 (deMauriac), and silver salts of imidazole and substituted imidazoles as described in U.S. Pat. No. 4,260,677 (Winslow et al.).

It is also convenient to use silver half soaps that are blends of silver carboxylates and carboxylic acids each having from 10 to 30 carbon atoms.

The methods used for making silver soap emulsions are well known in the art and are disclosed in *Research Disclosure*, April 1983, item 22812, *Research Disclosure*, October 1983, item 23419, U.S. Pat. No. 3,985,565 (Gabrielsen et al.), and the references cited above.

Non-photosensitive sources of reducible silver ions can also be provided as core-shell silver salts such as those described in U.S. Pat. No. 6,355,408 (Whitcomb et al.) or as silver dimer compounds that comprise two different silver salts as described in U.S. Pat. No. 6,472,131 (Whitcomb), both of which are incorporated by reference in their entirety.

Still other useful sources of non-photosensitive reducible silver ions are the silver core-shell compounds comprising a primary core comprising one or more photosensitive silver halides, or one or more non-photosensitive inorganic metal salts or non-silver containing organic salts, and a shell at least partially covering the primary core, wherein the shell comprises one or more non-photosensitive silver salts, each of which silver salts comprises a organic silver coordinating ligand. Such compounds are described in U.S. Pat. No. 6,803,177 (Bokhonov et al.), which is incorporated by reference in its entirety.

The one or more non-photosensitive sources of reducible silver ions are preferably present in an amount of from about 5% to about 70% (more preferably, from about 10% to about 50%), based on the total dry weight of the emulsion layers. Stated another way, the amount of the sources of reducible silver ions is generally present in an amount of from about 0.001 to about 0.2 mol/m$^2$ of the thermographic material, and preferably from about 0.006 to about 0.012 mol/m$^2$ of that material.

Reducing Agents

The thermographic materials include one or more reducing agents (of the same or different types) to reduce the silver ions during imaging. Such reducing agents are well known to those skilled in the art and include, for example, aromatic di- and tri-hydroxy compounds having at least two hydroxy groups in ortho- or para-relationship on the same aromatic nucleus such as hydroquinone and substituted hydroquinones, catechols, pyrogallol, gallic acid and gallic acid esters (for example, methyl gallate, ethyl gallate, propyl gallate), and tannic acid.

Particularly preferred are catechol-type reducing agents having no more than two hydroxy groups in an ortho-relationship.

One particularly preferred class of catechol-type reducing agents are benzene compounds in which the benzene nucleus is substituted by no more than two hydroxy groups which are present in 2,3-position on the nucleus and have in the 1-position of the nucleus a substituent linked to the nucleus by means of a carbonyl group. Compounds of this type include 2,3-dihydroxy-benzoic acid and 2,3-dihydroxy-benzoic acid esters (such as methyl 2,3-dihydroxy-benzoate, and ethyl 2,3-dihydroxy-benzoate).

Another particularly preferred class of catechol-type reducing agents are benzene compounds in which the benzene nucleus is substituted by no more than two hydroxy groups which are present in 3,4-position on the nucleus and have in the 1-position of the nucleus a substituent linked to the nucleus by means of a carbonyl group. Compounds of this type include, for example, 3,4-dihydroxy-benzoic acid, 3-(3,4-dihydroxy-phenyl)-propionic acid, 3,4-dihydroxy-benzoic acid esters (such as methyl 3,4-dihydroxy-benzoate, and ethyl 3,4-dihydroxy-benzoate), 3,4-dihydroxy-benzaldehyde, and phenyl-(3,4-dihydroxyphenyl)ketone. 3,4-Dihydroxybenzonitrile is also useful. Such compounds are described, for example, in U.S. Pat. No. 5,582,953 (Uyttendaele et al.), which is incorporated by reference in its entirety.

Mixtures of catechol reducing agents with various substituents can be used to optimize reactivity, Dmax, Dmin, and other imaging properties of the thermographic material.

Still another particularly useful class of reducing agents are the polyhydroxy spiro-bis-indane compounds that are described in U.S. Pat. No. 3,440,049 (Moede) and U.S. Pat. No. 5,817,598 (Defieuw et al.), both of which are incorporated by reference in their entirety.

In some constructions, "hindered phenol reducing agents" can be used. "Hindered phenol reducing agents" are compounds that contain only one hydroxy group on a given phenyl ring and have at least one additional substituent located ortho to the hydroxy group.

One type of hindered phenol includes hindered phenols and hindered naphthols.

Another type of hindered phenol reducing agents are hindered bis-phenols. These compounds contain more than one hydroxy group each of which is located on a different phenyl ring. This type of hindered phenol includes, for example, binaphthols (that is dihydroxybinaphthyls), biphenols (that is dihydroxybiphenyls), bis(hydroxynaphthyl)methanes, bis(hydroxyphenyl)-methanes bis(hydroxyphenyl)ethers, bis(hydroxyphenyl)sulfones, and bis(hydroxyphenyl)thioethers, each of which may have additional substituents.

Preferred hindered phenol reducing agents are bis(hydroxyphenyl)-methanes such as, bis(2-hydroxy-3-t-butyl-5-methylphenyl)methane (CAO-5), 1,1'-bis(2-hydroxy-3,5-dimethylphenyl)-3,5,5-trimethylhexane (NONOX® or PERMANAX® WSO), and 1,1'-bis(2-hydroxy-3,5-dimethylphenyl)isobutane (LOWINOX® 22IB46). Mixtures of hindered phenol reducing agents can be used if desired.

Further reducing agents include certain ortho-amino-phenol, para-amino-phenol, and hydroquinone (that is, para-hydroxy-phenol) compounds described in U.S. Pat. No. 7,135,432 (Whitcomb et al.), which is incorporated by reference in its entirety.

The reducing agent (or mixture thereof) described herein is generally present in an amount greater than 0.1 mole per mole of silver and at 1 to 10% (dry weight) of the emulsion layer. In multilayer constructions, if the reducing agent is added to a layer other than an emulsion layer, slightly higher proportions, of from about 2 to 15 wt % may be more desirable. Any co-developers may be present generally in an amount of from about 0.001% to about 1.5% (dry weight) of the emulsion layer coating.

Stated another way, the reducing agents described herein can be present in an amount of at least 0.03 mol/mol of total silver. Preferably, they are present in an amount of from about 0.05 to about 2 mol/mol of total silver. The total amount of silver in the thermographic materials is at least 3 mmol/m$^2$ and preferably from about 6 to about 12 mmol/m$^2$.

Other Addenda

The direct thermographic materials can also contain other additives such as toners, shelf-life stabilizers, contrast enhancers, dyes or pigments, post-processing stabilizers or stabilizer precursors, thermal solvents (also known as melt formers), and other image-modifying agents as would be readily apparent to one skilled in the art.

Suitable stabilizers that can be used alone or in combination include thiazolium salts as described in U.S. Pat. No. 2,131,038 (Staud) and U.S. Pat. No. 2,694,716 (Allen), azaindenes as described in U.S. Pat. No. 2,886,437 (Piper), triazaindolizines as described in U.S. Pat. No. 2,444,605 (Heimbach), the urazoles described in U.S. Pat. No. 3,287,135 (Anderson), sulfocatechols as described in U.S. Pat. No. 3,326,652 (Plumat), the oximes described in GB 623,448 (Kodak), polyvalent metal salts as described in U.S. Pat. No. 2,839,405 (Jones), thiuronium salts as described in U.S. Pat. No. 3,220,839 (Herz), palladium, platinum, and gold salts as described in U.S. Pat. No. 2,566,263 (Trirelli) and U.S. Pat. No. 2,597,915 (Yutzy et al.), compounds having —SO$_2$CBr$_3$ groups as described in U.S. Pat. No. 5,369,000 (Sakizadeh et al.), U.S. Pat. No. 5,464,737 (Sakizadeh et al.), U.S. Pat. No. 5,594,143 (Kirk et al.), U.S. Pat. No. 5,374,514 (Kirk et al.), and U.S. Pat. No. 5,460,938 (Kirk et al.).

Stabilizer precursor compounds capable of releasing stabilizers upon application of heat during imaging can also be used, as described in U.S. Pat. No. 5,158,866 (Simpson et al.), U.S. Pat. No. 5,175,081 (Krepski et al.), U.S. Pat. No. 5,298,390 (Sakizadeh et al.), and U.S. Pat. No. 5,300,420 (Kenney et al.).

In addition, certain substituted-sulfonyl derivatives of benzo-triazoles may be used as stabilizing compounds as described in U.S. Pat. No. 6,171,767 (Kong et al.).

"Toners" or derivatives thereof that improve the image are desirable components of the thermographic materials. These compounds, when added to the imaging layer, shift the color of the image from yellowish-orange to brown-black or blue-black. Generally, one or more toners described herein are present in an amount of from about 0.01% to about 10% (more preferably from about 0.1% to about 10%), based on the total dry weight of the layer in which the toner is included. Toners may be incorporated in the thermographic emulsion layer or in an adjacent non-imaging layer.

Compounds useful as toners are described in U.S. Pat. No. 3,074,809 (Owen), U.S. Pat. No. 3,080,254 (Grant, Jr.), U.S. Pat. No. 3,446,648 (Workman), U.S. Pat. No. 3,844,797 (Willems et al.), U.S. Pat. No. 3,847,612 (Winslow), U.S. Pat. No. 3,951,660 (Hagemann et al.), U.S. Pat. No. 4,082,901 (Laridon et al.), U.S. Pat. No. 4,123,282 (Winslow), U.S. Pat. No. 5,599,647 (Defieuw et al.), and GB 1,439,478 (AGFA).

Additional useful toners are substituted and unsubstituted mercaptotriazoles as described in U.S. Pat. No. 3,832,186 (Masuda et al.), U.S. Pat. No. 5,149,620 (Simpson et al.), U.S. Pat. No. 6,165,704 (Miyake et al.), U.S. Pat. No. 6,713,240 (Lynch et al.), and U.S. Pat. No. 6,841,343 (Lynch et al.), all of which are incorporated by reference in their entirety.

Phthalazine and phthalazine derivatives, such as those described in U.S. Pat. No. 6,146,822 (Asanuma et al.), which is incorporated by reference in its entirety. Phthalazinone, and phthalazinone derivatives are particularly useful toners.

A combination of one or more hydroxyphthalic acids and one or more phthalazinone compounds can be included in the thermographic materials. Hydroxyphthalic acid compounds have a single hydroxy substituent that is in the meta position to at least one of the carboxy groups. Preferably, these compounds have a hydroxy group in the 4-position and carboxy groups in the 1- and 2-positions. The hydroxyphthalic acids can be further substituted in other positions of the benzene ring as long as the substituents do not adversely affect their intended effects in the thermographic material. Mixtures of hydroxyphthalic acids can be used if desired.

Useful phthalazinone compounds are those having sufficient solubility to completely dissolve in the formulation from which they are coated. Preferred phthalazinone compounds include 6,7-dimethoxy-1-(2H)-phthalazinone, 4-(4-pentylphenyl)-1-(2H)-phthalazinone, and 4-(4-cyclohexylphenyl)-1-(2H)-phthalazinone. Mixtures of such phthalazinone compounds can be used if desired.

This combination facilitates obtaining a stable bluish-black image after processing. In preferred embodiments, the molar ratio of phthalazinone to hydroxyphthalic acid is from about 1:1 to about 3:1. More preferably the ratio is from about 2:1 to about 3:1.

The direct thermographic materials may also include one or more thermal solvents (or melt formers). Combinations of these compounds can also be used, such as a combination of succinimide and dimethylurea. Known thermal solvents are disclosed in U.S. Pat. No. 3,438,776 (Yudelson), U.S. Pat. No. 5,250,386 (Aono et al.), U.S. Pat. No. 5,368,979 (Freedman et al.), U.S. Pat. No. 5,716,772 (Taguchi et al.), and U.S. Pat. No. 6,013,420 (Windender).

The thermographic materials can also include one or more image stabilizing compounds that are usually incorporated in a "backside" layer. Such compounds can include phthalazinone and its derivatives, pyridazine and its derivatives, benzoxazine and benzoxazine derivatives, benzothiazine-dione and its derivatives, and quinazoline-dione and its derivatives, particularly as described in U.S. Pat. No. 6,599,685 (Kong). Other useful backside image stabilizers include anthracene compounds, coumarin compounds, benzophenone compounds, benzotriazole compounds, naphthalic acid imide compounds, pyrazoline compounds, or compounds described in U.S. Pat. No. 6,465,162 (Kong et al.) and GB 1,565,043 (Fuji Photo).

The thermographic materials may also include one or more additional polycarboxylic acids (other than the hydroxyphthalic acids noted above) and/or anhydrides thereof that are in thermal working relationship with the sources of reducible silver ions in the one or more thermographic layers. Such polycarboxylic acids can be substituted or unsubstituted aliphatic (such as glutaric acid and adipic acid) or aromatic compounds and can be present in an amount of at least 5 mol % ratio to silver. They can be used in anhydride or partially esterified form as long as two free carboxylic acids remain in the molecule. Useful polycarboxylic acids are described for example in U.S. Pat. No. 6,096,486 (Emmers et al.).

Support Materials

The thermally developable materials may comprise a polymeric support that is preferably a flexible, transparent film that has any desired thickness and is composed of one or more polymeric materials, depending upon their use. The supports are generally transparent (especially if the material is used as a photomask) or at least translucent, but in some instances, opaque supports may be useful. They are required to exhibit dimensional stability during thermal imaging and development and to have suitable adhesive properties with overlying layers. Useful polymeric materials for making such supports include polyesters, cellulose acetate and other cellulose esters, polyvinyl acetal, polyolefins, polycarbonates, and polystyrenes. Exemplary supports are composed of polyesters such as polyethylene terephthalate film or polycarbonates.

Opaque supports can also be used, such as dyed polymeric films and resin-coated papers that are stable to high temperatures. Support materials can contain various colorants, pigments, and dyes if desired. For example, the support can contain conventional blue dyes that differ in absorbance from colorants in the various frontside or backside layers as described in U.S. Pat. No. 6,248,442 (Van Achere et al.). Support materials may be treated using conventional procedures (such as corona discharge) to improve adhesion of overlying layers, or subbing or other adhesion-promoting layers can be used.

The support thickness can be within the range of from about 2 to about 15 µm. Preferably, the support thickness is from about 4 to about 10 µm.

Binders

The non-photosensitive source(s) of reducible silver ions, the reducing agent(s), toners, and any other additives may be combined with one or more polymer binders, such as polyvinyl acetal binders or polyvinylpyrrolidone-vinyl acetate binders, which may be hydrophobic in nature. Either aqueous or organic solvent-based formulations can be used to prepare the silver layer of thermally developable materials.

The polyvinyl acetals are the predominant binders in the thermally developable layers, meaning that they comprise between about 50% by weight and about 100% by weight of the total binder weight, between about 50% by weight and about 90% by weight of the total binder weight, etc. Polyvinyl acetal is the generic name for the class of polymers formed by the reaction of polyvinyl alcohol with one or more aldehydes. Polyvinyl acetal is also the name for the specific member of this class formed by reaction of polyvinyl alcohol and acetaldehyde. Typically, the aldehyde is formaldehyde or an aliphatic aldehyde having 2 to 4 carbon atoms. Acetaldehyde and butyraldehyde are commonly used aldehydes and form polyvinyl acetal (the specific polymer) and polyvinyl butyral respectively. In one exemplary embodiment, the polyvinyl acetal is polyvinyl butyral, polyvinyl acetal, or mixtures thereof.

In some embodiments, the binder may comprise a polyvinyl butyral resin, such as shown below.

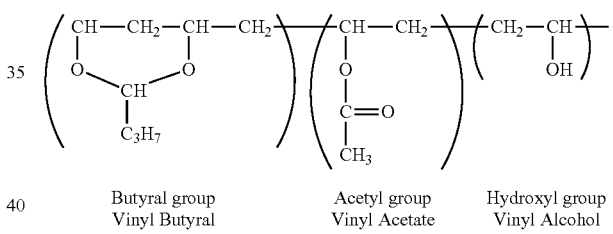

| Butyral group | Acetyl group | Hydroxyl group |
| Vinyl Butyral | Vinyl Acetate | Vinyl Alcohol |

Such a binder may be prepared by a reaction of one or more polyvinyl alcohol hydroxyl groups and an aldehyde, such as butyraldehyde. In general, a polymer containing vinyl alcohol repeat units may also contain vinyl acetate repeat units, since the vinyl alcohol repeat units are generally formed from at least some of the vinyl acetate repeat units in the polymer by, for example, hydrolysis. The reaction of the hydroxyl groups with the aldehyde may be represented as:

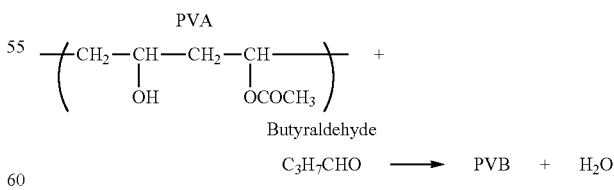

where PVA represents polyvinyl alcohol and PVB represents the resulting polyvinyl butyral resin.

Since the complete reaction of polymeric hydroxyl groups with the aldehyde may not take place, the product polymer may also comprise vinyl alcohol and vinyl acetate repeat units in addition to the vinyl butyral repeat units, as shown above. In some embodiments, the binder may comprise at least one butyral group, at least one acetyl group, and optionally, at least one hydroxyl group. In some embodiments, the binder may be a terpolymer of monomers comprising vinyl butyral, vinyl alcohol, and optionally, vinyl acetate. In some embodiments, binders may comprise copolymers of at least one first repeat unit comprising repeat units derived from at least one vinyl alcohol, at least one second repeat unit comprising repeat units derived from at least one butyraldehyde, and optionally at least one third repeat unit comprising repeat units derived from at least one vinyl acetate.

The characteristics and properties of polyvinyl butyral by itself or in a mixture to form the silver layer comprising a photosensitive catalyst may affect the silver efficiency, print stability, or accelerated aging of the film that comprises the silver layer. These properties include, but are not limited to, molecular weight, vinyl alcohol composition in terms of mol % or mole fraction, solution viscosity, total binder weight or concentration, weight fraction of the binders if more than one is being used, and glass transition temperature. These properties may be interrelated in their effect on the silver efficiency, print stability, or accelerated aging of the film. These differences in these properties and their effect on the silver efficiency, print stability, or accelerated aging of the film were examined and compared to the control system, which was deemed to have acceptable silver efficiency, sensitometry, print stability, and accelerated aging measurements.

The control system is a binder system of 50% by weight of B03TX and 50% by weight of B45H. B03TX is a polyvinyl butyral resin having a hydroxyl content of 16-20 wt %, maximum acetate content of 3 wt %, maximum free acid content of 0.05 wt %, and maximum volatile content of 3 wt %. B03TX is available from Chang Chun PetroChemical Co., Ltd. under the trade name CCP B03TX PVB. B45H is a polyvinyl butyral resin having a non-volatile content of at least 97.5 wt %, hydroxyl group (vinyl alcohol group) content from about 18 wt % to about 21 wt %, acetyl group (vinyl acetate group) content from about 1 wt % to about 4 wt %. B45H is available from Kuraray Europe GmbH, BU PVB under the trade name MOWITAL® PIOLOFORM® B 45 H PVB. B20H is a polyvinyl butyral resin having a non-volatile content of at least 97.5 wt %, hydroxyl group (vinyl alcohol group) content from about 18 wt % to about 21 wt %, acetyl group (vinyl acetate group) content from about 1 wt % to about 4 wt %.

Vinyl polymers can be used in thermographic layers in varying amounts. Non-limiting examples of vinyl polymers include vinylpyrrolidone or vinyl acetate polymers or combinations thereof, such as for example, polyvinylpyrrolidone-vinyl acetate or other materials readily apparent to one skilled in the art.

Additional ("secondary") hydrophobic binders can be used in the thermographic layers if desired. Examples of typical secondary hydrophobic binders include low molecular weight polyvinyl acetal resins, polyvinyl chloride, polyvinyl acetate, cellulose acetate, cellulose acetate butyrate, polyolefins, polyesters, polystyrenes, polyacrylonitrile, polycarbonates, methacrylate copolymers, maleic anhydride ester copolymers, butadiene-styrene copolymers, and other materials readily apparent to one skilled in the art.

Hardeners for various binders may be present in any layer of the thermally developable material if desired. Useful hardeners including crosslinking agents, are well known and include polyisocyanate compounds as described in EP 0 600 586 B1 (3M) and U.S. Pat. No. 6,313,065 (Horsten et al.), vinyl sulfone compounds as described in U.S. Pat. No. 6,143,487 (Philip, Jr. et al.) and EP 0 640 589 A1 (Kodak), and aldehydes and various other hardeners as described in U.S. Pat. No. 6,190,822 (Dickerson et al.).

The use of polyisocyanates to crosslink the polyvinyl acetal binder permits the use of lower polymerized polyvinyl acetal binders in the thermographic emulsion layers. When such crosslinking agents are used, a polyvinyl acetal having a degree polymerization of about 500 or more can be used. Preferred isocyanates are those described below as crosslinkers for the non-light-sensitive adhesive layer. Aromatic polyisocyanates are more preferred.

The non-imaging layers of the thermally developable materials can also include one or more of the same or different hydrophobic binders as described above for the imaging layer. Binders particularly useful for various backside layers and frontside overcoats are described below.

The polymer binder(s) is used in the thermally developable layer in an amount sufficient to carry the components dispersed therein. The total binders may comprise from about 10% to about 90% by weight (more preferably at a level of from about 20% to about 70% by weight) of the total dry weight of the layer. The B03TX PVB binder may be between about 30% by weight and about 70% by weight of the total PVB binder of the layer. The B45H PVB binder may be between about 30% by weight and about 70% by weight of the total PVB binder of the layer. The B20H PVB binder may be between about 10% by weight and about 40% by weight of the total PVB binder of the layer. In some embodiments, the PVB weight percent ratio of B03TX to B45H to B20H may be about 50 to 50 to 0. In some embodiments, the PVB weight percent ratio of B03TX to B45H to B20H may be about 56 to 21 to 23.

Top Coat Layer

A top coat layer may be disposed on the silver layer, which may comprise silver particles dispersed in a binder. In some embodiments, the top coat layer may be formed from a composition comprising benzotriazole compound. The top coat composition may comprise between about 0% by weight and about 0.250% by weight, between about 0.05% by weight and about 0.20% by weight, or about 0.181% by weight of benzotriazole.

Silver Efficiency

As noted above, silver efficiency is Dmax divided by the total silver coating weight in units of grams per square meter (Dmax/Ag). An objective may be to increase Dmax or silver efficiency for a certain silver coating weight. In some embodiments, the silver coating weight may be between about 1.5 grams per square meter and 2.15 grams per square meter. In some embodiments, the silver coating weight may be between about 1.5 grams per square meter and 2.05 grams per square meter. In some embodiments, the silver coating weight may be between about 1.60 grams per square meter and 1.80 grams per square meter. In some embodiments, the silver coating weight may be between about 2.00 grams per square meter and 2.15 grams per square meter.

Print Stability

In print stability, measurements of ΔDmin are taken of imaged films under different conditions of light, humidity, and temperature for different amounts of time. As noted above, the term ΔDmin (lower case) is the change in minimum density between the initial Dmin (lower case) and final Dmin (lower case) after being subjected to a print stability test, accelerated aging test, etc. In thermally developable materials, one goal is to minimize ΔDmin.

Accelerated Aging

In accelerated aging, measurements of ΔDmin are taken of films prior to imaging under different conditions of light, humidity, and temperature for different amounts of time. As noted above, the term ΔDmin (lower case) is the change in minimum density between the initial Dmin (lower case) and final Dmin (lower case) after being subjected to a print stability test. In thermally developable materials, one goal is to minimize ΔDmin.

Exemplary Embodiments

U.S. Provisional Application No. 62/074,681, filed Nov. 4, 2014, entitled "IMAGE FORMING MATERIALS, PREPARATIONS, AND COMPOSITIONS," which is hereby incorporated by reference in its entirety, disclosed the following five non-limiting exemplary embodiments:
A. A coating composition comprising:
  at least one non-photosensitive source of reducible silver ions,
  at least one reducing agent capable of reducing the reducible silver ions,
  a first binder comprising vinyl butyral repeat units and vinyl alcohol repeat units,
  a second binder comprising vinyl butyral repeat units and vinyl alcohol repeat units, the second binder having a composition differing from that of the first binder, and
  a third binder comprising vinyl pyrrolidone repeat units and vinyl acetate repeat units.
B. The coating composition of embodiment A, wherein the coating composition comprises 5 percent by weight of the third binder.
C. An image forming material comprising a support and having thereon at least one thermally developable imaging layers comprising in reactive association:
  at least one non-photosensitive source of reducible silver ions,
  at least one reducing agent capable of reducing the reducible silver ions,
  a first binder comprising vinyl butyral repeat units and vinyl alcohol repeat units,
  a second binder comprising vinyl butyral repeat units and vinyl alcohol repeat units, the second binder having a composition differing from that of the first binder, and
  a third binder comprising vinyl pyrrolidone repeat units and vinyl alcohol repeat units.
D. The image forming material of embodiment C, wherein the image forming material comprises a thermally developable material and further comprises a photosensitive silver halide, the thermally developable material being a photothermographic material.
E. The image forming material of embodiment C, further comprising benzotriazole.

EXAMPLES

Materials

All materials used in the following examples are readily available from standard commercial sources, such as Sigma-Aldrich Co. LLC (e.g. methanol, methyl ethyl ketone, pyridinium hydrobromide perbromide, and maleic acid) unless otherwise specified.

B03TX is a polyvinyl butyral resin having a hydroxyl content of 16-20 wt %, maximum acetate content of 3 wt %, maximum free acid content of 0.05 wt %, and maximum volatile content of 3 wt %. B03TX is available from Chang Chun PetroChemical Co., Ltd. under the trade name CCP B03TX PVB.

B45H is a polyvinyl butyral resin having a non-volatile content of at least 97.5 wt %, hydroxyl group (vinyl alcohol group) content from about 18 wt % to about 21 wt %, acetyl group (vinyl acetate group) content from about 1 wt % to about 4 wt %. It has a dynamic viscosity of 60-90 mPa·s in a 10% ethanol solution. B45H is available from Kuraray Europe GmbH, BU PVB under the trade name MOWITAL® PIOLOFORM® B 45 H PVB. B03TX has a LOWER molecular weight and a HIGHER glass transition temperature than B45H, which has a glass transition temperature of about 69 degrees Celsius.

B20H is a polyvinyl butyral resin having a non-volatile content of at least 97.5 wt %, hydroxyl group (vinyl alcohol group) content from about 18 wt % to about 21 wt %, acetyl group (vinyl acetate group) content from about 1 wt % to about 4 wt %. It has a dynamic viscosity of 20-30 mPa·s in a 10% ethanol solution. It has a glass transition temperature of about 64° C. B20H is available from Kuraray Europe GmbH, BU PVB under the trade name MOWITAL® PIOLOFORM® B 20 H PVB.

PVP-VA is polyvinylpyrrolidone-vinyl acetate available from the BASF Chemical Co under the trade name Luviskol® VA 64P, which may also be known as Kollidon or Sokalan VA 64P.

B60HH is a polyvinyl butyral resin having a non-volatile content of at least 97.5 wt %, hydroxyl group (vinyl alcohol group) content from about 12 wt % to about 16 wt %, acetyl group (vinyl acetate group) content from about 1 wt % to about 4 wt %. B60HH is available from Kuraray Europe GmbH, BU PVB under the trade name MOWITAL® PIOLOFORM® B 60 HH PVB.

THDI is a trimer of an aliphatic hexamethylene diisocyanate. THDI is available from Bayer MaterialScience LLC under the trade name DESMODUR® N 3300A.

MEK is methyl ethyl ketone (or 2-butanone).

THDI premix is a solution of 66.6 wt % THDI and 33.3 wt % MEK.

MeOH is methanol.

BZT is benzotriazole.

PARALOID® A-21 is an acrylic polymer available from Rohm and Haas, a wholly owned subsidiary of The Dow Chemical Company.

CAO-5 is based on a sterically hindered alkylated bisphenol that is available from commercial sources, such as Great Lakes Chemical Corp. now a part of Chemtura Corp., Chitec Tech. Corp., or Akrochem Corp. It has the following structure:

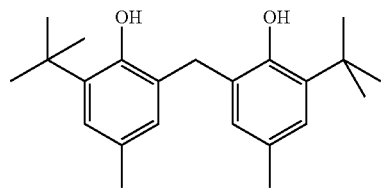 [SMILES: Cc1cc(Cc2cc(C)cc(C(C)(C)C)c2O)c(O)c(C(C)(C)C)c1]

Trisphenol has the following structure:

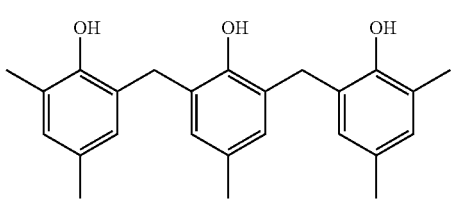

Irganox 1010 is a sterically hindered phenolic antioxidant that is available from commercial sources, such as Akrochem Corp., Ciba Specialty Chemicals now a part of BASF Corp., or Chitec Tech. Corp. It has the following structure:

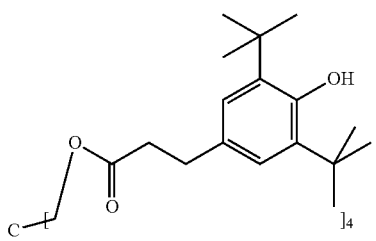 [SMILES: CCOC(=O)CCc1cc(C(C)(C)C)c(O)c(C(C)(C)C)c1]

AD-1, which is also known as DBT, is an IR Acutance Dye that is available from KP Synchem or Eastman Kodak. It has the following structure:

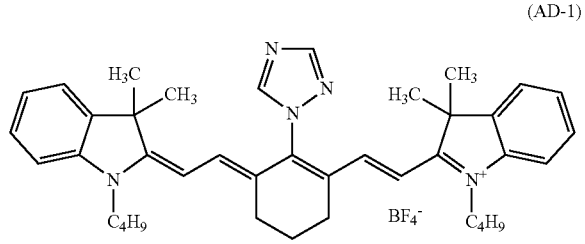

(AD-1)

Sensitizing Dye A is described in U.S. Pat. No. 5,541,054 (Miller et al.) and has the structure shown below. It is benzothiazolium, 3-ethyl-2[[7-[[3-ethyl-5-(methylthio)-2 (3H)-benzothiazolylidene)methyl]-4,4a,5,6-tetrahydro-2 (3H)-napthalenylidene]methyl]-5-(methylthio)-, iodide, which may be referred to as JM4.

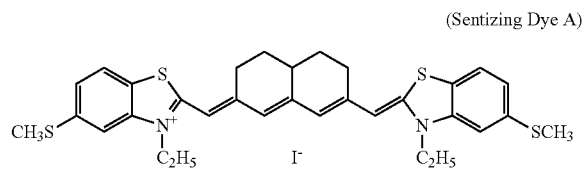

(Sentizing Dye A)

TD-1 is a tinting dye, which may be referred to as HSR-31. It is a magenta masking dye supplied from Mitsubishi. It has the following structure:

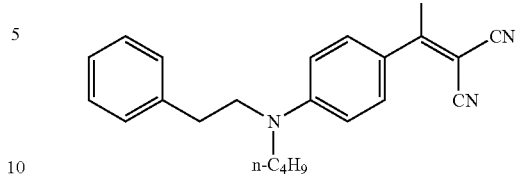

(TD-1)

SD-1 is a support dye with the following structure:

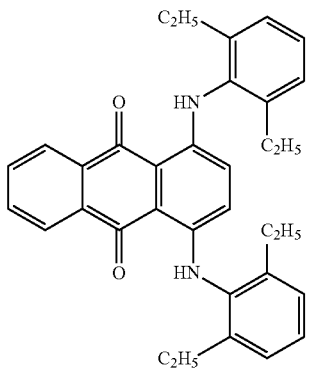

(SD-1)

PHP is pyridinium hydrobromide perbromide.

Zinc bromide is available from Inabata & Co., Ltd. (Osaka, Japan).

2-mercapto-5-methylbenzimidazole is available from Akrochem Corp. (Akron, Ohio).

2-(4-chlorobenzoyl)benzoic acid is available from Hallo-Chem Pharma Co., Ltd. (Chongqing, China).

2-(tribromomethylsulphonyl)pyridine) is available Inabata & Co., Ltd. (Osaka, Japan).

Tetrachlorophthalic acid is available Inabata & Co., Ltd. (Osaka, Japan).

4-methylphthalic acid is available from Eastman Kodak (Rochester, N.Y.).

Phthalazine is available from PCI Synthesis (Newburyport, Mass.).

Cellulose acetate butyrate is available from Eastman Chemical Co. (Kingsport, Tenn.).

Ethyl 2-cyano-3-hydroxy-butanoate, also referred to as CY-27, is available from Pharmasynthese (France).

1,3-Bis(vinylsulfonyl)-2-propanol, also referred to as P-382, is available Eastman Kodak (Rochester, N.Y.).

Methods

Preparation of Silver Emulsion Formulations

A preformed silver halide, silver carboxylate soap dispersion, was prepared in similar fashion to that described in U.S. Pat. No. 5,939,249, US Patent Application Publication No. 2008/0057450, and U.S. Patent Application Publication No. 2009/0081578, which are hereby incorporated by reference in their entirety. The preformed silver halide, silver carboxylate soap dispersion was made by mixing 26.70 wt % of preformed silver halide, silver carboxylate soap, 2.25 wt % of and B60HH PVB, 71.04 wt % MEK. The dispersion was homogenized to form a homogenate of 30.36 wt % of solids.

To 161.88 parts by weight of the homogenate, 36.95 parts by weight of MEK was added and mixed at a rate of 400 rpm at a temperature of 67° F. After 10 minutes, 0.238 parts by weight of a 15% by weight of a solution of PHP in 1.35 parts by weight MeOH was added with continued stirring. After 45 minutes of mixing, 0.232 parts by weight of an 11% by weight of a zinc bromide solution in 1.86 parts by weight of MeOH was added with continued stirring.

After 30 minutes, a solution of 0.0073 parts by weight Sensitizing Dye A, 0.150 parts by weight of 2-mercapto-5-methylbenzimidazole, 1.66 parts by weight of 2-(4-chlorobenzoyl)benzoic acid, 10.81 parts by weight of MeOH, and 3.78 parts by weight of MEK was added under safelights. After stirring for 60 minutes, the temperature was lowered to 50° F., and the mixture was divided into several samples.

Six additions were then made to each of the silver emulsion formulation samples. Solution A, defined below, was added at 67° F., and mixed at a mixing rate of 400 rpm for 5 minutes. A selected composition of resins (B45H, B03TX, B20H, and/or PVP-VA) was then added at 1200 rpm for 15 minutes, allowing the temperature to drop to 50° F. Three developers, defined below, were then added at 50° F., and mixed at a mixing rate of 1200 rpm for 5 minutes. Solution B, defined below, was then added at 50° F., and mixed at a mixing rate of 1200 rpm for 5 minutes. Solution C, defined below, was then added at 50° F., and mixed at a mixing rate of 1200 rpm for 5 minutes. Finally, Solution D, defined below, was then added at 50° F., and mixed at a mixing rate of 1200 rpm for 20 minutes.

Solution A, Developer Solution, Solution B, and Solution C were added to each of the emulsion formulation samples and mixed at a mixing rate of 1200 rpm, 5 minutes apart. Solution D was added and mixed at a mixing rate of 1200 rpm for 20 minutes.

| Solution A | |
| --- | --- |
| 2-(Tribromomethylsulphonyl)pyridine | 0.806 parts by weight |
| Tetrachlorophthalic acid | 0.369 parts by weight |
| 4-Methylphthalic acid | 0.717 parts by weight |
| MEK | 16.314 parts by weight |
| MeOH | 0.282 parts by weight |
| Developers | |
| CAO-5 | 2.10 parts by weight |
| Trisphenol | 2.67 parts by weight |
| Irganox 1010 | 7.53 parts by weight |
| Solution B | |
| THDI | 0.658 parts by weight |
| MEK | 0.328 parts by weight |
| Solution C | |
| Phthalazine | 1.325 parts by weight |
| MEK | 6.290 parts by weight |
| Solution D | |
| Maleic Acid | 0.043 parts by weight |
| MEK | 1.177 parts by weight |

Preparation of Top Coat Formulations

A base top coat formulation was prepared by adding the materials below.

| Polymer Premix | 374.67 parts by weight |
| --- | --- |
| MEK | 92.178% |
| PARALOID ® A-21 | 0.657% |
| Cellulose acetate butyrate | 7.165% |
| Ethyl 2-cyano-3-hydroxy-butanoate | 0.675 parts by weight |
| 1,3-Bis(vinylsulfonyl)-2-propanol | 1.128 parts by weight |

-continued

| THDI premix | 3.005 parts by weight |
| --- | --- |
| MEK | 39.34 parts by weight |
| TD-1 | 0.0172 parts by weight |
| AD-1 | 0.405 parts by weight |

For samples with BZT in the top coat, BZT was added to the base top coat formulation at a ratio of 0.326 parts by weight to 180 parts by weight. For samples without BZT in the top coat, the base top coat formulation was used.

Preparation of Imaging Forming Materials

Each of the emulsion samples and a top coat formulation were simultaneously coated onto a 7 mil (about 178 μm) polyethylene terephthalate support, tinted blue with support dye SD-1. The backside of the support had been pre-coated with an anti-halation and antistatic layer having an absorbance greater than 0.3 between 805 and 815 nm, and a resistivity of less than $10^{11}$ ohms/square. An automated dual knife coater equipped with an in-line dryer was used. Immediately after coating, samples were dried in a forced air oven at about 100° C. for about 5 minutes. The emulsion formulation was coated to obtain a coating weight of between about 1.65 and 2.00 g of total silver/m². The top coat formulation was coated to obtain about a dry coating weight of about 0.2 g/ft² (2.2 g/m²) and an absorbance in the imaging layer of between 0.9 and 1.35 at 810 μm.

Development of Image Forming Materials

Samples of each of the imaging forming material were cut into strips, exposed with a laser sensitometer at 810 nm, and thermally developed to generate continuous tone wedges with image densities varying from a minimum density (Dmin) to a maximum density (Dmax) possible for the exposure source and development conditions. Development was carried out on a 6 inch diameter (15.2 cm) heated rotating drum. The strip contacted the drum for 210 degrees of its revolution, about 11 inches (28 cm). Samples were developed at 122.5° C. for 15 seconds at a rate of 0.733 inches/sec (112 cm/min). A strip sample of each imaging forming material was scanned using a computerized densitometer equipped with both a visible filter and a blue filter having peak transmission at about 440 nm.

Measurements at Calculations of Silver Efficiency

The Dmin, Dmax, AC-1, speed-2, print stability, and accelerated aging were measured using the blue filter. Dmin, Dmax, speed-2, speed-3, and AC-1 were taken of samples developed at 122.5° C. for 15 seconds. Silver efficiency was calculated for each sample by dividing Dmax by silver coating weight in g/m². The silver coating weight of each film sample was measured by X-ray fluorescence using commonly known techniques.

Evaluation of Print Stability

Continuous tone wedge strip samples of each developed image forming material as prepared above, were subjected to different conditions after the film were imaged: 1) 3 hours in the dark at about 160° F. (hot-dark print stability test) and 2) 20 hours in a light chamber at 120° F. (light chamber print stability test).

Regarding the hot-dark print stability test, a set of processed samples was stacked together and tightly double-bagged in two high-density, flat-black polyethylene bags. Three strips of polyethylene terephthalate support tinted blue with support dye SD-1 were placed above and below the stack of film samples. The bagged samples were then placed in an oven and heated at 68-74° C., for 3 hours. Upon cooling to room temperature, the samples were removed from the bag and re-scanned using the same densitometer and blue filter.

Regarding the light chamber print stability test, a set of processed samples was place in a light chamber. Upon cooling to room temperature, the samples were removed from the bag and re-scanned using the same densitometer and blue filter.

Each sample subjected to different conditions was then re-scanned using the same computer densitometer and using the blue filter having a peak transmittance at about 440 nm. The changes in $Dmin_{Blue}$ ($\Delta Dmin_{Blue}$), $Dmax_{Blue}$, ($\Delta Dmax_{Blue}$), and OD-Blue ($\Delta OD$-Blue) were recorded to determine print stability.

Evaluation of Accelerated Aging

Continuous tone wedge strip samples of each developed image forming material as prepared above, was subjected to different conditions before the film is imaged. These conditions include variations of temperature and relative humidity for a selected duration. Each sample subjected to different conditions was then re-scanned using the same computer densitometer and using the blue filter having a peak transmittance at about 440 nm. The changes in Dmin were recorded to determine accelerated aging.

Example 1

Several samples of imaging forming material were made according to the preparations discussed in the method section. Samples were prepared with silver layers and top coats of different composition. The silver layers of the samples were created during the preparation of the silver emulsion formulations from different compositions selected from B45H, B03TX, B20H, and/or PVP-VA. Samples had a PVB weight fraction ratio of B03TX to B45H to B20H (wt %/wt %/wt %) of either 50/50/0 or 56/21/23 and weight fraction of PVP-VA or 0 wt %, 5 wt %, 10 wt %, or 15 wt %. Samples having a PVB weight fraction ratio of B03TX to B45H to B20H of 56/21/23 have approximately 4 wt % more PVB than samples having a PVB weight fraction ratio of B03TX to B45H to B20H of 50/50/0.

The top coat layers of the samples were created during the preparation of the top coat formulations by either adding or omitting BZT.

Table 1 shows the initial sensitometry measurements for image forming materials having silver layers and top coats layers of varying composition. It is noted that each pair of consecutive samples was meant to have identical composition as a check for error if the samples in the pair had substantially different sensitometry measurements. Samples 1-1 and 1-2 were the control samples that provided a benchmark for acceptable sensitometry, print stability, and accelerated aging measurements. Samples 1-9 and 1-10 show optimal results with increased silver efficiency (Dmax/Ag), similar Dmin, and at least equal to or higher speed-2 and speed-3 than control samples 1-1 and 1-2.

Table 2 shows print stability measurements for image forming materials having silver layers and top coat layers of varying composition. Samples 1-9 and 1-10 had acceptable print stability measurements since they were close to the corresponding values for samples 1-1 and 1-2.

Table 3 shows accelerated aging measurements for image forming materials having silver layers and top coat layers of varying composition. Samples 1-9 and 1-10 had acceptable accelerated aging measurements since they were close to the corresponding values for samples 1-1 and 1-2.

The invention has been described in detail with reference to specific embodiments, but it will be understood that variations and modifications can be effected within the spirit and scope of the invention. The presently disclosed embodiments are therefore considered in all respects to be illustrative and not restrictive. The scope of the invention is indicated by the claims that will issue from applications claiming benefit of this provisional application, and all changes that come within the meaning and range of equivalents thereof are intended to be embraced therein.

TABLE 1

| Sample | PVB Weight Fraction Ratio of B03TX to B45H to B20H (wt %/wt %/wt %) | PVP-VA (wt %) | BZT (wt %) | Silver Efficiency Dmax/Ag | Dmin | Speed-2 | Speed-3 |
| --- | --- | --- | --- | --- | --- | --- | --- |
| COM-1-1 | 50/50/0 | 0 | 0.181 | 2.10 | 0.200 | 1.72 | 1.21 |
| COM-1-2 | 50/50/0 | 0 | 0.181 | 2.15 | 0.200 | 1.74 | 1.24 |
| 1-3 | 50/50/0 | 0 | 0 | 2.19 | 0.200 | 1.70 | 1.27 |
| 1-4 | 50/50/0 | 0 | 0 | 2.23 | 0.199 | 1.71 | 1.26 |
| 1-5 | 56/21/23 | 0 | 0 | 2.28 | 0.201 | 1.75 | 1.27 |
| 1-6 | 56/21/23 | 0 | 0 | 2.24 | 0.199 | 1.79 | 1.32 |
| 1-7 | 50/50/0 | 5 | 0.181 | 2.22 | 0.199 | 1.66 | 1.18 |
| 1-8 | 50/50/0 | 5 | 0.181 | 2.20 | 0.199 | 1.68 | 1.19 |
| 1-9 | 56/21/23 | 5 | 0 | 2.32 | 0.199 | 1.71 | 1.30 |
| 1-10 | 56/21/23 | 5 | 0 | 2.31 | 0.201 | 1.73 | 1.30 |
| 1-11 | 50/50/0 | 10 | 0.181 | 2.18 | 0.200 | 1.60 | 1.13 |
| 1-12 | 50/50/0 | 10 | 0.181 | 2.22 | 0.199 | 1.63 | 1.17 |
| 1-13 | 56/21/23 | 10 | 0 | 2.30 | 0.199 | 1.66 | 1.29 |
| 1-14 | 56/21/23 | 10 | 0 | 2.29 | 0.201 | 1.65 | 1.21 |
| 1-15 | 50/50/0 | 15 | 0.181 | 2.19 | 0.200 | 1.55 | 1.09 |
| 1-16 | 50/50/0 | 15 | 0.181 | 2.22 | 0.199 | 1.57 | 1.10 |
| 1-17 | 56/21/23 | 15 | 0 | 2.34 | 0.199 | 1.58 | 1.18 |
| 1-18 | 56/21/23 | 15 | 0 | 2.35 | 0.200 | 1.61 | 1.21 |

| | Hot-Dark 3 hr. in dark at 160° F. | | | Light Chamber 20 hrs. in light chamber at 120° F. | |
| --- | --- | --- | --- | --- | --- |
| Sample | $\Delta Dmin_B$ | $\Delta D$ at 1.2 IOD | $\Delta Dens_B$ (max) | $\Delta Dmin_B$ | $\Delta Dmin_V$ |
| COM-1-1 | 0.011 | 0.20 | 0.23 | 0.09 | 0.07 |
| COM-1-2 | 0.012 | 0.15 | 0.18 | 0.08 | 0.06 |
| 1-3 | 0.016 | 0.21 | 0.27 | 0.10 | 0.08 |

| | Hot-Dark 3 hr. in dark at 160° F. | | | Light Chamber 20 hrs. in light chamber at 120° F. | |
|---|---|---|---|---|---|
| Sample | $\Delta Dmin_B$ | $\Delta D$ at 1.2 IOD | $\Delta Dens_B$ (max) | $\Delta Dmin_B$ | $\Delta Dmin_Y$ |
| 1-4 | 0.012 | 0.21 | 0.23 | 0.10 | 0.08 |
| 1-5 | 0.018 | 0.19 | 0.20 | 0.10 | 0.09 |
| 1-6 | 0.018 | 0.23 | 0.25 | 0.10 | 0.09 |
| 1-7 | 0.010 | 0.11 | 0.19 | 0.08 | 0.05 |
| 1-8 | 0.011 | 0.13 | 0.20 | 0.07 | 0.06 |
| 1-9 | 0.012 | 0.28 | 0.30 | 0.09 | 0.07 |
| 1-10 | 0.014 | 0.31 | 0.35 | 0.09 | 0.07 |
| 1-11 | 0.009 | 0.13 | 0.35 | 0.06 | 0.05 |
| 1-12 | 0.006 | 0.11 | 0.28 | 0.07 | 0.05 |
| 1-13 | 0.012 | 0.28 | 0.40 | 0.07 | 0.06 |
| 1-14 | 0.012 | 0.21 | 0.31 | 0.08 | 0.06 |
| 1-15 | 0.009 | 0.10 | 0.37 | 0.06 | 0.05 |
| 1-16 | 0.010 | 0.05 | 0.31 | 0.05 | 0.04 |
| 1-17 | 0.011 | 0.19 | 0.52 | 0.07 | 0.06 |
| 1-18 | 0.012 | 0.21 | 0.43 | 0.07 | 0.05 |

| 14 Day 120° F., 50% RH | |
|---|---|
| Sample | $\Delta Dmin$ |
| COM-1-1 | 0.005 |
| COM-1-2 | 0.003 |
| 1-3 | 0.007 |
| 1-4 | 0.009 |
| 1-5 | 0.010 |
| 1-6 | 0.010 |
| 1-7 | 0.004 |
| 1-8 | 0.005 |
| 1-9 | 0.009 |
| 1-10 | 0.006 |
| 1-11 | 0.003 |
| 1-12 | 0.004 |
| 1-13 | 0.009 |
| 1-14 | 0.008 |
| 1-15 | 0.003 |
| 1-16 | 0.004 |
| 1-17 | 0.008 |
| 1-18 | 0.007 |

What is claimed:

1. A coating composition comprising:
   at least one non-photosensitive source of reducible silver ions,
   at least one reducing agent capable of reducing the reducible silver ions,
   a first binder comprising vinyl butyral repeat units and vinyl alcohol repeat units,
   a second binder comprising vinyl butyral repeat units and vinyl alcohol repeat units, the second binder having a composition differing from that of the first binder, and
   a third binder comprising vinyl pyrrolidone repeat units and vinyl acetate repeat units.

2. The coating composition according to claim 1, wherein the coating composition comprises 5 percent by weight of the third binder.

3. The coating composition according to claim 1, further comprising benzotriazole.

4. An image forming material comprising a support and having thereon at least one thermally developable imaging layers comprising in reactive association:
   at least one non-photosensitive source of reducible silver ions,
   at least one reducing agent capable of reducing the reducible silver ions,
   a first binder comprising vinyl butyral repeat units and vinyl alcohol repeat units,
   a second binder comprising vinyl butyral repeat units and vinyl alcohol repeat units, the second binder having a composition differing from that of the first binder, and
   a third binder comprising vinyl pyrrolidone repeat units and vinyl alcohol repeat units.

5. The image forming material according to claim 4, further comprising benzotriazole.

* * * * *

UNITED STATES PATENT AND TRADEMARK OFFICE
CERTIFICATE OF CORRECTION

Page 1 of 1

PATENT NO. : 9,523,915 B2
APPLICATION NO. : 14/868503
DATED : December 20, 2016
INVENTOR(S) : Erin C. Pavlacky It is certified that error appears in the above-identified patent and that said Letters Patent is hereby corrected as shown below:

In the Specification

Column 24, Line 57     Insert --TABLE 2--
Column 25, Line 24     Insert --TABLE 3--

Signed and Sealed this
Fourth Day of July, 2017

Joseph Matal
*Performing the Functions and Duties of the*
*Under Secretary of Commerce for Intellectual Property and*
*Director of the United States Patent and Trademark Office*